United States Patent
Li et al.

(10) Patent No.: US 12,326,479 B2
(45) Date of Patent: Jun. 10, 2025

(54) LEAKAGE CURRENT DETECTION AND INTERRUPTION DEVICE AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 143 days.

(21) Appl. No.: 18/469,407

(22) Filed: Sep. 18, 2023

(65) Prior Publication Data

US 2025/0060422 A1   Feb. 20, 2025

(30) Foreign Application Priority Data

Aug. 17, 2023   (CN) .......................... 202311041220.4
Aug. 17, 2023   (CN) .......................... 202322213295.8

(51) Int. Cl.
*G01R 31/52* (2020.01)
*G08B 7/06* (2006.01)
*G08B 29/18* (2006.01)
*H02H 1/00* (2006.01)
*H02H 3/04* (2006.01)

(52) U.S. Cl.
CPC .............. *G01R 31/52* (2020.01); *G08B 7/06* (2013.01); *G08B 29/181* (2013.01); *H02H 1/0007* (2013.01); *H02H 3/04* (2013.01)

(58) Field of Classification Search
CPC ..................................................... G01R 31/52
See application file for complete search history.

(56) References Cited

U.S. PATENT DOCUMENTS

| | | | | |
|---|---|---|---|---|
| 9,857,448 | B1* | 1/2018 | Li | G01R 31/52 |
| 9,871,366 | B1* | 1/2018 | Li | H02H 3/044 |
| 11,658,475 | B1* | 5/2023 | Li | H02H 1/0007 |
| | | | | 361/42 |
| 2007/0164750 | A1* | 7/2007 | Chen | H02H 3/335 |
| | | | | 324/527 |
| 2012/0287537 | A1* | 11/2012 | Huang | H02H 3/04 |
| | | | | 361/42 |
| 2016/0252557 | A1* | 9/2016 | Li | H02H 3/335 |
| | | | | 324/509 |
| 2018/0149690 | A1* | 5/2018 | Li | H02H 3/338 |

(Continued)

*Primary Examiner* — Travis R Hunnings
(74) *Attorney, Agent, or Firm* — Chen Yoshimura LLP (57) ABSTRACT

A leakage current detection and interruption device includes a switch module; a leakage current detection module for detecting leakage current signal on current carrying lines and generating a leakage fault signal in response thereto; a drive module, coupled to the switch module and the leakage current detection module, for driving the switch module to disconnect electrical connection on the current carrying lines in response to the leakage fault signal; a self-test module, coupled to the leakage current detection module and the drive module, for periodically generating a simulated leakage current signal and detecting malfunction in the leakage current detection module and/or drive module, and generating a self-test fault signal in response thereto; and an alarm module, coupled to the self-test module, for generating an alarm signal in response to the leakage fault signal and/or self-test fault signal. The device can alert the user under tripped or malfunction conditions.

8 Claims, 6 Drawing Sheets

(56) References Cited

U.S. PATENT DOCUMENTS

| | | | | |
|---|---|---|---|---|
| 2019/0115748 A1* | 4/2019 | Li | ............... | H01R 13/713 |
| 2021/0111554 A1* | 4/2021 | Li | ............... | H02H 7/20 |
| 2021/0118869 A1* | 4/2021 | Li | ............... | G01R 31/50 |
| 2021/0265832 A1* | 8/2021 | Li | ............... | H02H 3/335 |
| 2021/0313796 A1* | 10/2021 | Li | ............... | H02H 1/0007 |
| 2023/0268730 A1* | 8/2023 | Li | ............... | H02H 3/335 |
| | | | | 361/87 |
| 2023/0307901 A1* | 9/2023 | Li | ............... | H02H 7/008 |
| 2024/0097426 A1* | 3/2024 | Chen | ............... | H01H 83/04 |
| 2024/0421582 A1* | 12/2024 | Li | ............... | H02H 1/0061 |
| 2024/0426940 A1* | 12/2024 | Li | ............... | G01R 31/3275 |
| 2024/0426941 A1* | 12/2024 | Li | ............... | G01R 31/52 |

* cited by examiner

LEAKAGE CURRENT DETECTION AND INTERRUPTION DEVICE AND RELATED ELECTRICAL CONNECTORS AND ELECTRICAL APPLIANCES

BACKGROUND OF THE INVENTION

This invention relates to electrical circuits, and in particular, it relates to a leakage current detection and interruption device, and related electrical connectors and electrical appliances.

With increased safety awareness, more and more consumers install electrical fault detection and protection devices in their homes, such as ground fault circuit interrupter devices (GFCI), arc fault circuit interrupter devices (AFCI), portable residual current protective device (PRCD), etc.

However, many such circuit interrupter devices only have a switch opening (tripping) function which can disconnect power at the output end in response to a fault condition; they cannot provide protection functions when the device has a malfunction and cannot trip, which presents a hidden safety threat.

SUMMARY OF THE INVENTION

To solve the above problems, the present invention provides a leakage current detection and interruption device, which includes: a switch module, coupled on a plurality of current carrying lines between an input end and an output end, configured to connect or disconnect an electrical connection between the input end and the output end; a leakage current detection module, configured to detect a leakage current signal on the plurality of current carrying lines and to generate a leakage fault signal in response to detecting the leakage current signal; a drive module, coupled to the switch module and the leakage current detection module, configured to receive the leakage fault signal, and to drive the switch module to disconnect the electrical connection in response to the leakage fault signal; a self-test module, coupled to the leakage current detection module and the drive module, configured to periodically generate a simulated leakage current signal to detect a malfunction in the leakage current detection module and/or the drive module, and to generate a self-test fault signal in response to detecting the malfunction of the leakage current detection module and/or the drive module; and an alarm module, coupled to the self-test module, configured to receive the self-test fault signal, and to generate an alarm signal in response to the leakage fault signal and/or the self-test fault signal.

In some embodiments, the alarm module includes an alarm element for generating the alarm signal.

In some embodiments, the alarm element includes at least one of a buzzer, a speaker, an indicator light, and a light emitting element.

In some embodiments, the alarm signal includes a flashing light signal and/or an intermittent audible signal.

In some embodiments, the alarm module includes a first capacitor and/or a first resistor, coupled in parallel with the alarm element.

In some embodiments, the self-test module includes a voltage triggered element and a second capacitor coupled in series, and wherein the second capacitor is charged by one of the current carrying lines and periodically generates the simulated leakage current signal in cooperation with the voltage triggered element.

In some embodiments, the self-test module further includes a semiconductor device, wherein when both the leakage current detection module and the drive module function normally, the semiconductor device is configured to be triggered under action of the leakage fault signal to become conductive to provide a discharge path for the second capacitor, and wherein when the leakage current detection module and/or the drive module has a malfunction, the semiconductor device remains non-conductive and provide no discharge path for the second capacitor, wherein the self-test module generates the self-test fault signal in response thereto.

In some embodiments, the semiconductor device is selected from: a silicon controlled rectifier, a bipolar junction transistor, a field-effect transistor, and a photocoupler.

In some embodiments, the device further includes a monitor module, coupled to the leakage current detection module, wherein the monitor module includes a test switch and is configured to generate a simulated leakage fault signal in response to the test switch being operated, to detect whether the device is functioning normally.

In a second aspect, the present invention provides an electrical power connection device, which includes: a body; and a leakage current detection and interruption device according to any of the above embodiments, disposed inside the body.

In a third aspect, the present invention provides an electrical appliance, which includes: an electrical load; and an electrical power connection device coupled between a power supply and the electrical load, configured to supply power to the electrical load, wherein the electrical power connection device includes a leakage current detection and interruption device according to any of the above embodiments.

In embodiments of the present invention, by providing an alarm module in the leakage current detection and interruption device, when the device malfunctions and loses its detection or tripping (interruption) function, it can still generate an alarm signal to alert the user. This prevents fire and other danger and reduces hidden safety threats, thereby improving the safety of the electrical fault detection and interruption device. Further, the electrical fault detection and interruption devices according to embodiments of the present invention have a simple structure, are low cost and safe.

BRIEF DESCRIPTION OF DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

DETAILED DESCRIPTION OF THE INVENTION

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

Embodiments of the present invention provide a leakage current detection and interruption device, which includes an alarm module so that when the device malfunctions and loses its detection or tripping (interruption) function, it can still generate an alarm signal to alert the user. This prevents fire and other danger and reduces hidden safety threats, thereby improving the safety of the electrical fault detection and interruption device. Further, the electrical fault detection and interruption devices according to embodiments of the present invention have a simple structure, are low cost and safe.

Figure 1:
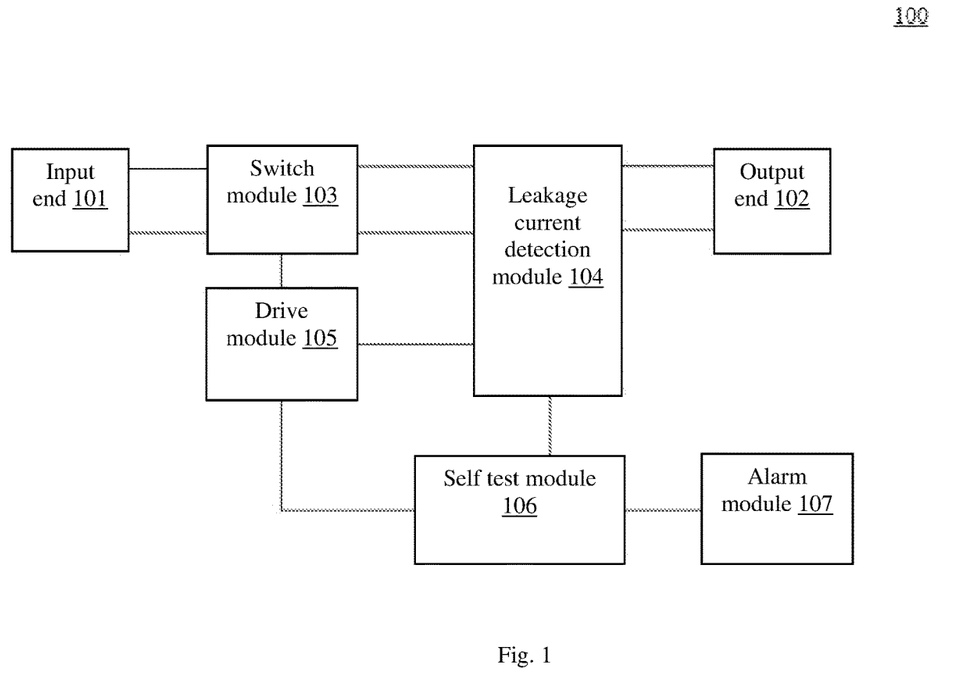
FIG. 1 is a block diagram illustrating a leakage current detection and interruption device according to embodiments of the present invention.

FIG. 1 is a block diagram illustrating a leakage current detection and interruption device according to some embodiments of the present invention. As shown in FIG. 1, the electrical fault detection and interruption device 100 includes a switch module 103, a leakage current detection module 104, a drive module 105, a self-test module 106, and an alarm module 107. The switch module 103 is coupled between the input end 101 and output end 102 of the power supply lines, and controls the electrical connection and disconnection btw the input and output ends. The power supply lines may include a first current carrying line (L) coupled to the hot line of the power source, and a second current carrying line (N) coupled to the neutral line of the power source. The leakage current detection module 104 functions to detect a leakage current signal on the current carrying lines, and to generate a leakage fault signal in response thereto. The drive module 105 is coupled to the switch module 103 and leakage current detection module 104, and functions to receive the leakage fault signal and to drive the switch module 103 to disconnect the power in response to the leakage fault signal. The self-test module 106 is coupled to the leakage current detection module 104 and drive module 105, and functions to periodically generate a simulated leakage current signal (i.e. self-test signal) to test whether the leakage current detection module 104 and/or drive module 105 has a malfunction, and to generate a self-test fault signal if the leakage current detection module 104 and/or drive module 105 has a malfunction. The alarm module 107 is coupled to the self-test module 106, to receive the self-test fault signal and to generate an alarm signal in response to the leakage fault signal and/or self-test fault signal.

The leakage current detection and interruption device 100 can generate an alarm signal to alert the user when the device has a malfunction and/or is tripped, to prevent danger and eliminate hidden safety threats, and improves the safety of the device. Further, leakage current detection and interruption device has a simple structure, is low cost, and safe.

In some embodiments, the alarm module 107 includes an alarm element for generating the alarm signal. The alarm element may be, for example, a buzzer, a speaker, an indicator light, a light emitting element, or other types of alarm elements, or any combinations thereof. The light emitting element may be a light emitting diode (LED). The alarm signal may be an intermittent audible signal, a flashing light signal, or their combinations. In these embodiments, the electrical fault detection and interruption device can alert the user via the intermittent audible signals and/or flashing light signals when the device has a malfunction and/or is tripped; such signals are more audible or visible than simple alarm signals, and can effectively attract the user's attention, reducing hidden danger and improving the safety and reliability of the device.

In some embodiments, the alarm module 107 includes a first capacitor and/or first resistor coupled in parallel with the alarm element.

In some embodiments, the self-test module 106 includes a voltage triggered element and a second capacitor coupled in series. The second capacitor is charged by a current carrying line, and periodically generates the simulated leakage current signal in cooperation with the voltage triggered element.

In some embodiment, the self-test module 106 further includes a semiconductor device, which functions to control the conductivity of the current path it is coupled on. The semiconductor device may be any one of a silicon controlled rectifier (SCR), bipolar junction transistor (BJT), field-effect transistor (FET), photocoupler, etc. When the leakage current detection module 104 and the drive module 105 function normally, the semiconductor device can be triggered under the action of the leakage fault signal to become conductive, which provides a discharge path for the second capacitor. When the leakage current detection module 104 and/or drive module 105 malfunctions, the semiconductor device cannot provide a discharge path for the second capacitor, causing the self-test module 106 to generate the self-test fault signal.

In some embodiment, the leakage current detection and interruption device 100 further includes a monitor module, coupled to the leakage current detection module 104 and includes a test switch. When the test switch is manually operated, the monitor module generates a simulated leakage fault signal to test whether the leakage current detection and interruption device is functioning normally.

Figure 2:
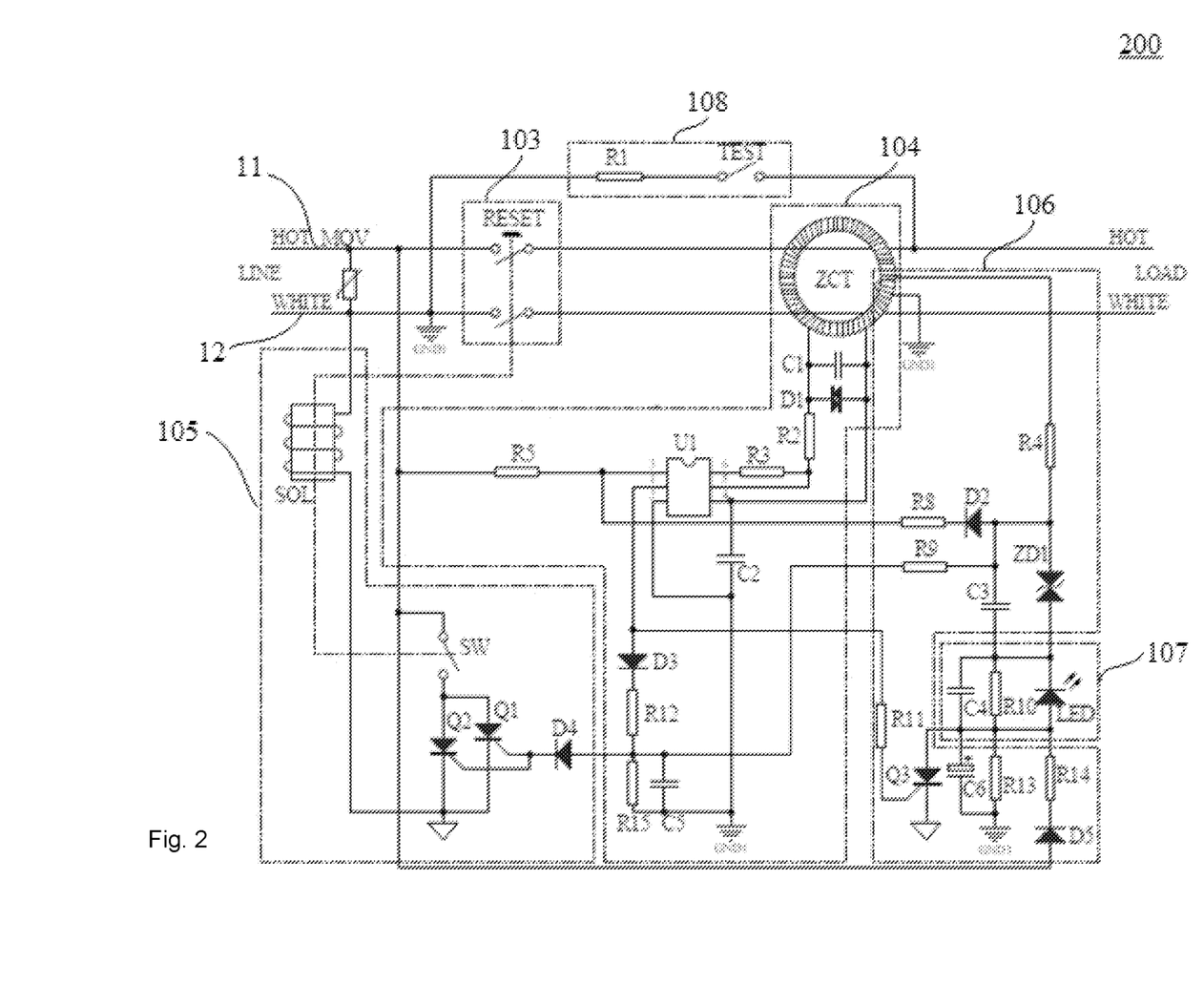
FIG. 2 is a circuit diagram of a leakage current detection and interruption device according to a first embodiment of the present invention.

FIG. 2 is a circuit diagram of a leakage current detection and interruption device according to a first embodiment of the present invention.

As shown in FIG. 2, the leakage current detection and interruption device 200 is coupled between the input end LINE and output end LOAD of the current carrying lines, and includes a switch module 103, a leakage current detection module 104, a drive module 105, a self-test module 106, an alarm module 107, and a monitor module 108. The current carrying lines include a first current carrying line L (HOT) 11 and a second current carrying line N (WHITE) 12. The leakage current detection module 104 includes a zero sequence current transformer ZCT and a leakage current detection chip U1 along with its peripheral circuit elements, where the first current carrying line 11 and the second current carrying line 12 pass through the zero sequence current transformer ZCT. The switch module 103 includes a reset switch RESET, which functions to control the electrical connection of the current carrying lines. The drive module 105 includes a switch drive element (such as a solenoid SOL), two silicon controlled rectifiers Q1 and Q2, and an auxiliary switch SW. The auxiliary switch SW is mechanically linked to the reset switch RESET so that they open and close at the same time. The self-test module 106 includes a voltage triggered element ZD1 (such as a trigger diode), a capacitor C6 (second capacitor), a silicon controlled rectifier Q3 (semiconductor device) and peripheral circuit elements. In some other embodiments, the silicon controlled rectifier Q3 may be omitted, and the self-test module 106 shares silicon controlled rectifier Q1 and/or Q2 with the drive module 105, i.e., the silicon controlled rectifier Q1 and/or Q2 is coupled in parallel with capacitor C6 to provide a discharge path when the silicon controlled rectifier is conductive. The alarm module 107 includes a resistor R10 (first resistor), a capacitor C4 (first capacitor), and a light emitting diode LED (alarm element) which is coupled in parallel with resistor R10 and capacitor C4 and coupled in series with capacitor C6. The monitor module 108 includes serial coupled resistor R1 and test switch TEST.

When the leakage current detection and interruption device 200 is performing leakage current detection, the reset switch RESET and auxiliary switch SW are both closed. When the currents on the first current carrying line 11 and second current carrying line 12 are balanced, the zero sequence current transformer ZCT does not detect a current imbalance. When the first current carrying line 11 or second current carrying line 12 has a leakage current, the zero sequence current transformer ZCT detects the leakage current and generates a corresponding induction signal at its secondary winding. The zero sequence current transformer ZCT is coupled to the leakage current detection chip U1 to transfer the induction signal to the leakage current detection chip U1 for processing. When the processed leakage current signal is higher than a preset threshold, pin 1 of the leakage current detection chip U1 outputs a high voltage level (the leakage fault signal); otherwise, it outputs a low voltage signal. The high voltage level at pin 1 is provided via diodes D3, D4 and resistor R12 to the control electrodes of silicon controlled rectifier Q1 and Q2, triggering silicon controlled rectifier Q1 and/or Q2 to become conductive. As a result, a current flows through the solenoid SOL, generating a sufficiently large electromagnetic force to drive the reset switch RESET of the switch module 103 to disconnect the electrical connection between the input and output ends, and to open the auxiliary switch SW at the same time.

The leakage current detection and interruption device 200 has a self-test function. A current from the first current carrying line 11 charges capacitor C6 via the current path 11-D5-R14. As the voltage across capacitor C6 rises, the voltage across the voltage triggered element ZD1 rises with it. After a predetermined time period, the voltage across the voltage triggered element ZD1 reaches its trigger voltage, triggering it to become conductive. As a result, a current flows through the path C6-C4-R4 to generate a simulated leakage current. The voltage on capacitor C6 also supplies the leakage current detection chip U1 (during the negative half-cycle of the AC current) via D2-R8, and charges capacitor C5 via resistor R9. When the leakage current detection and interruption device 200 functions normally, i.e., both the leakage current detection module 104 and drive module 105 function normally, if the zero sequence current transformer ZCT detects the simulated leakage current, it generates a corresponding induction signal at its secondary winding and transfers the signal to the leakage current detection chip U1, causing leakage current detection chip U1 to output a high voltage level at pin 1, triggering silicon controlled rectifier Q3 to become conductive. At this time, capacitor C6 is rapidly discharged via silicon controlled rectifier Q3 and solenoid SOL, and the voltage across it drops rapidly. When the voltage drops to below the trigger voltage of the voltage triggered element ZD1, the voltage triggered element ZD1 turns off. The time period of this process is relatively short. By setting the capacitances of capacitors C4 and C5, the voltages across capacitors C4 and C5 rise slowly during this time period, and remain relatively low, such that they are insufficient to cause the light emitting diode LED to emit light and insufficient to trigger silicon controlled rectifiers Q1 and Q2 to become conductive, so as not to affect the normal function of the device 200. Therefore, during this process the light emitting diode LED does not emit light, and switch module 103 does not trip (i.e., it remains closed).

When the leakage current detection module 104 malfunctions and cannot detect the simulated leakage current, pin 1 of leakage current detection chip U1 remains at the low voltage level. Therefore, silicon controlled rectifier Q3 is not triggered to conduct, so capacitor C6 cannot discharge via silicon controlled rectifier Q3 and solenoid SOL. As a result, voltage triggered element ZD1 remains conductive for a long time period, allowing a current to continuously charge capacitors C4 and C5 via current path C6-C4-R9 (i.e., a self-test fault signal is produced). When the voltages across capacitors C4 and C5 rise to certain levels, sufficient to trigger the light emitting diode LED to emit light and sufficient to trigger silicon controlled rectifiers Q1 and Q2 to conduct, the light emitting diode LED emits light (i.e. alarm signal). If the drive module 105 functions normally, then silicon controlled rectifiers Q1 and/or Q2 become conductive; as a result, a current flows through the solenoid SOL, generating a sufficiently large electromagnetic force to drive the reset switch RESET of the switch module 103 to disconnect the electrical connection between the input and output ends. But if the drive module 105 also malfunctions, e.g. the solenoid SOL is an open circuit, then the switch module 103 remains closed.

If the leakage current detection module 104 functions normally but the drive module 105 malfunctions, e.g. the solenoid SOL is an open circuit, when the zero sequence current transformer ZCT detects the simulated leakage current and generates a corresponding induction signal at its secondary winding and transfers it to leakage current detection chip U1, leakage current detection chip U1 outputs a high voltage level at pin 1, triggering silicon controlled rectifier Q3 to become conductive. But because the solenoid SOL is an open circuit, capacitor C6 cannot discharge via the path of silicon controlled rectifier Q3 and solenoid SOL. As a result, voltage triggered element ZD1 remains conductive for a long time period, allowing a current to continuously charge capacitors C4 and C5 via current path C6-C4-R9 (i.e., a self-test fault signal is produced). Thus, the voltages across capacitors C4 and C5 rise to certain levels, sufficient to trigger the light emitting diode LED to emit light (i.e. the alarm signal) and to trigger silicon controlled rectifiers Q1 and Q2 to conduct. In this condition, the light emitting diode LED emits light and the switch module 103 remains closed.

As capacitor C6 is further discharged, voltage triggered element ZD1 turns off, so light emitting diode LED is extinguished. The current again charges capacitor C6 via current path 11-D5-R14; as the voltage across capacitor C6 rises again, voltage triggered element ZD1 is again conductive, and light emitting diode LED again emits light. This process repeats itself, with the result that light emitting diode LED flashes (i.e. a flashing light signal is generated). Thus, when the leakage current detection module 104 and/or drive module 105 malfunctions, light emitting diode LED produces a flashing light signal to alert the user, thereby avoiding danger and eliminating the hidden safety threat, further improving the safety of the device.

Further, the leakage current detection and interruption device 200 of FIG. 2 can test the leakage current detection and interruption function. When performing the test, the reset switch RESET is closed. The user manually closes the test switch TEST of the monitor module 108, forming a current path from first current carrying line 11 via resistor R1 to second current carrying line 12 to generate a simulated leakage current. The zero sequence current transformer ZCT detects this simulated leakage current and generates a corresponding induction signal, and transfers it to the leakage current detection chip U1. When the simulated leakage current is larger than a preset threshold, pin 1 of leakage current detection chip U1 outputs a high voltage level (leakage fault signal). The signal at pin 1 is provided to the control electrodes of silicon controlled rectifiers Q1 and Q2, triggering silicon controlled rectifiers Q1 and/or Q2 to become conductive. As a result, a current flows through the solenoid SOL, generating a sufficiently large electromagnetic force to drive the reset switch RESET of the switch module 103 to disconnect the electrical connection between the input and output ends. In other words, if in response to the test switch TEST being closed, the switch module 103 disconnects the electrical connection between the input and output ends of first and second current carrying lines 11 and 12, then it indicates that the leakage current detection and interruption device 200 has normal leakage current protection function; otherwise, it indicates that the leakage current protection function of the leakage current detection and interruption device 200 is lost, i.e. one or both of leakage current detection module 104 and drive module 105 is malfunctioning. By using the monitor module 108 to perform the test, malfunction in the leakage current detection and interruption device 200 can be discovered, reminding the user to replace the device.

Figure 3:
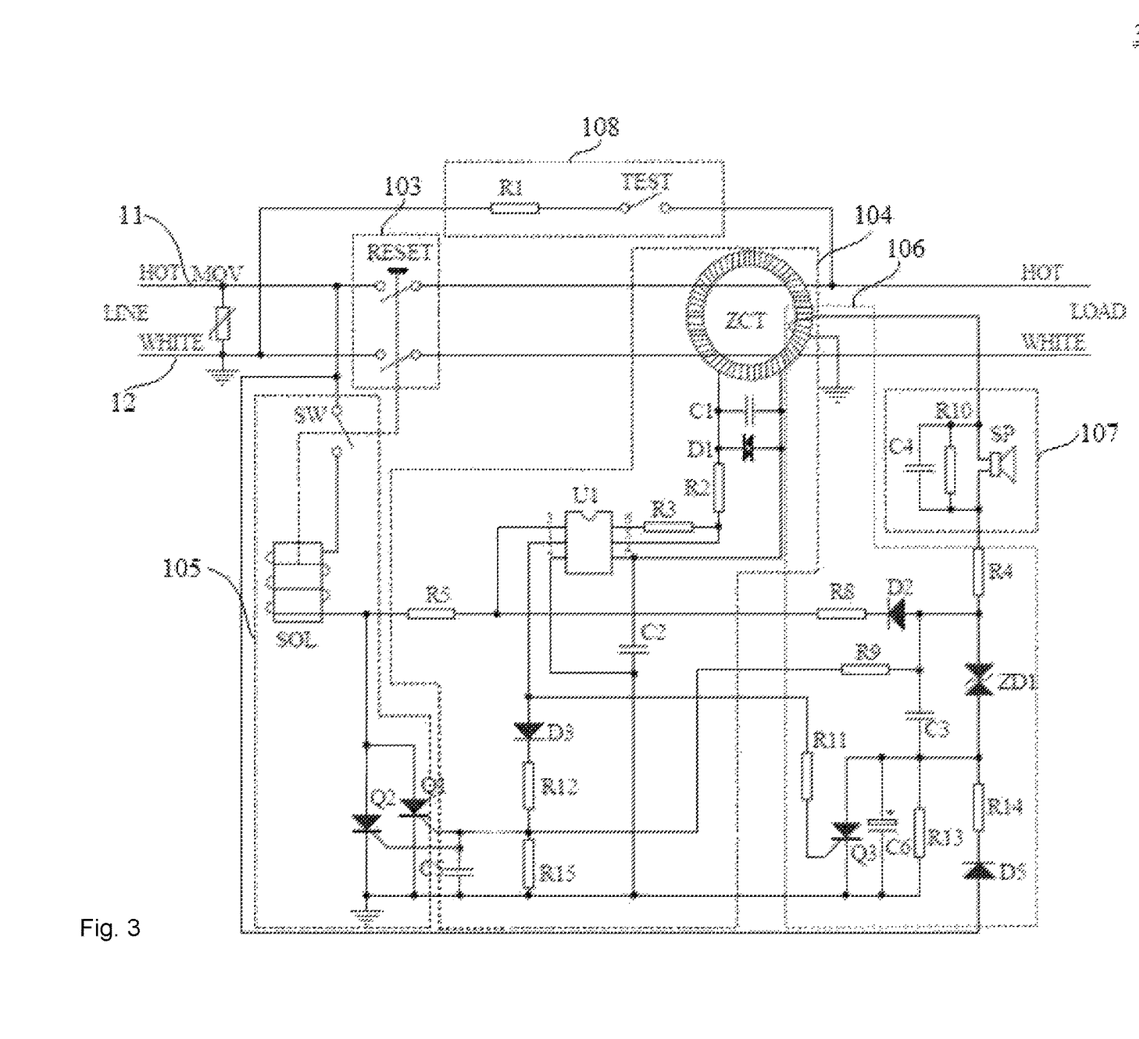
FIG. 3 is a circuit diagram of a leakage current detection and interruption device according to a second embodiment of the present invention.

FIG. 3 is a circuit diagram of a leakage current detection and interruption device according to a second embodiment of the present invention. Compared to the embodiment in FIG. 2, a main difference is that in the embodiment of FIG. 3, the auxiliary switch SW and solenoid SOL of the drive module 105 are located before silicon controlled rectifiers Q1 and Q2 and resistor R5; the light emitting diode LED in the alarm module 107 is replaced by a buzzer SP; and the alarm module 107 is located after the voltage triggered element ZD1.

When the leakage current detection and interruption device 300 is performing leakage current detection, the reset switch RESET and auxiliary switch SW are both closed. When the currents on the first current carrying line 11 and second current carrying line 12 are balanced, the zero sequence current transformer ZCT does not detect a current imbalance. When the first current carrying line 11 or second current carrying line 12 has a leakage current, the zero sequence current transformer ZCT detects the leakage current and generates a corresponding induction signal at its secondary winding. The zero sequence current transformer ZCT is coupled to the leakage current detection chip U1 to transfer the induction signal to the leakage current detection chip U1 for processing. When the processed leakage current signal is higher than a preset threshold, pin 1 of leakage current detection chip U1 outputs a high voltage level (leakage fault signal); otherwise, it outputs a low voltage signal. The high voltage level at pin 1 is provided via diode D3 and resistor R12 to the control electrodes of silicon controlled rectifiers Q1 and Q2, triggering silicon controlled rectifier Q1 and/or Q2 to become conductive. As a result, a current flows through the solenoid SOL, generating a sufficiently large electromagnetic force to drive the reset switch RESET of the switch module 103 to disconnect the electrical connection between the input and output ends, and to open the auxiliary switch SW at the same time. In this state, the first current carrying line 11 cannot supply power to leakage current detection chip U1 via solenoid SOL and resistor R5, so the self-test module 106 cannot complete self-test, causing the buzzer SP to beep intermittently (described in more detail later).

When the leakage current detection and interruption device 300 performs a self-test, a current from the first current carrying line 11 charges capacitor C6 via the current path 11-D5-R14. As the voltage across capacitor C6 rises, the voltage across the voltage triggered element ZD1 rises with it. After a predetermined time period, the voltage across the voltage triggered element ZD1 reaches its trigger voltage, triggering it to become conductive. As a result, a current flows through the path C6-R4-C4 to generate a simulated leakage current. The voltage on capacitor C6 also supplies power to leakage current detection chip U1 (during the negative half-cycle of the AC current) via D2-R8 and charges capacitor C5 via resistor R9. When the leakage current detection and interruption device 300 functions normally, i.e., both the leakage current detection module 104 and drive module 105 function normally, if zero sequence current transformer ZCT detects the simulated leakage current, it generates a corresponding induction signal at its secondary winding and transfers the signal to leakage current detection chip U1, causing leakage current detection chip U1 to output a high voltage level at pin 1, triggering silicon controlled rectifier Q3 to become conductive. At this time, capacitor C6 is rapidly discharged via silicon controlled rectifier Q3, and the voltage across it drops rapidly. When the voltage drops to below the trigger voltage of the voltage triggered element ZD1, the voltage triggered element ZD1 turns off. The time period of this process is relatively short. By setting the capacitances of capacitors C4 and C5, the voltages across capacitors C4 and C5 rise slowly during this time period, and remain relatively low, such that they are insufficient to cause the buzzer to beep, and insufficient to trigger silicon controlled rectifiers Q1 and Q2 to become conductive, so as not to affect the normal function of the device 300. Therefore, during this process the buzzer does not beep, and switch module 103 does not trip (i.e., it remains closed).

When the leakage current detection module 104 malfunctions and cannot detect the simulated leakage current, pin 1 of leakage current detection chip U1 remains at a low voltage level. Therefore, silicon controlled rectifier Q3 is not triggered to conduct, so capacitor C6 cannot discharge via silicon controlled rectifier Q3. As a result, the voltage triggered element ZD1 remains conductive for a long time period, allowing currents to continuously charge capacitor C4 via current path C6-R4 and charge capacitor C5 via current path C6-R9 (i.e., a self-test fault signal is produced), so that the voltages across capacitors C4 and C5 rise to certain levels, sufficient to trigger the buzzer SP to beep and sufficient to trigger silicon controlled rectifiers Q1 and Q2 to conduct. Therefore, the buzzer beeps (i.e. alarm signal). If the drive module 105 functions normally, then silicon controlled rectifiers Q1 and/or Q2 become conductive; as a result, a current flows through solenoid SOL, generating a sufficiently large electromagnetic force to drive the reset switch RESET of the switch module 103 to disconnect the electrical connection between the input and output ends, and also to open the auxiliary switch SW.

If the drive module 105 malfunctions, e.g. solenoid SOL is an open circuit, the first current carrying line 11 cannot supply power to leakage current detection chip U1 via solenoid SOL and resistor R5, so pin 1 of leakage current detection chip U1 remains at a low voltage level and cannot trigger silicon controlled rectifier Q3 to conduct. As a result, capacitor C6 cannot discharge via silicon controlled rectifier Q3, so the voltage triggered element ZD1 remains conductive for a long time period, allowing a current to continuously charge capacitor C4 via current path C6-R4 and charge capacitor C5 via current path C6-R9 (i.e., a self-test fault signal is produced). Thus, the voltages across capacitors C4 and C5 rise to certain levels, sufficient to trigger the buzzer to emit a sound (i.e. the alarm signal) and sufficient to trigger silicon controlled rectifiers Q1 and Q2 to conduct. Therefore, the buzzer emits a sound and the switch module 103 remains closed.

When both the leakage current detection module 104 and the drive module 105 function normally, and a leakage current on the first current carrying line 11 or second current carrying line 12 is detected, because the reset switch RESET of the switch module 103 disconnects the electrical connection between the input and output ends, and the auxiliary switch SW is open at the same time, the first current carrying line 11 cannot supply power to leakage current detection chip U1 via solenoid SOL and resistor R5, so pin 1 of leakage current detection chip U1 remains at a low voltage level and cannot trigger silicon controlled rectifier Q3 to conduct. As a result, capacitor C6 cannot discharge via silicon controlled rectifier Q3, so the voltage triggered element ZD1 remains conductive for a long time period, allowing a current to continuously charge capacitor C4 via current path C6-R4 and charge capacitor C5 via current path C6-R9 (i.e., a self-test fault signal is produced). Thus, the voltages across capacitor C4 rise to certain levels, sufficient to trigger the buzzer to emit a sound (i.e. the alarm signal).

As capacitor C6 is further discharged, voltage triggered element ZD1 turns off, and the buzzer stops beeping. The current again charges capacitor C6 via current path 11-D5-R14; as the voltage across capacitor C6 rises again, voltage triggered element ZD1 is again conductive, and buzzer SP again emits a sound. This process repeats itself, with the result that buzzer SP beeps, i.e. it emits an intermittent sound signal. Thus, when the leakage current detection module 104 and/or drive module 105 malfunctions, or when a leakage current is detected, buzzer SP can generate an intermittent sound signal to alert the user, thereby avoiding danger and eliminating the hidden safety threat, further improving the safety of the device.

The leakage current detection and interruption device 300 has a self-test function. The self-test function of the device 300 is similar to that of the device 200 of FIG. 2, and detailed descriptions are omitted here.

Figure 4:
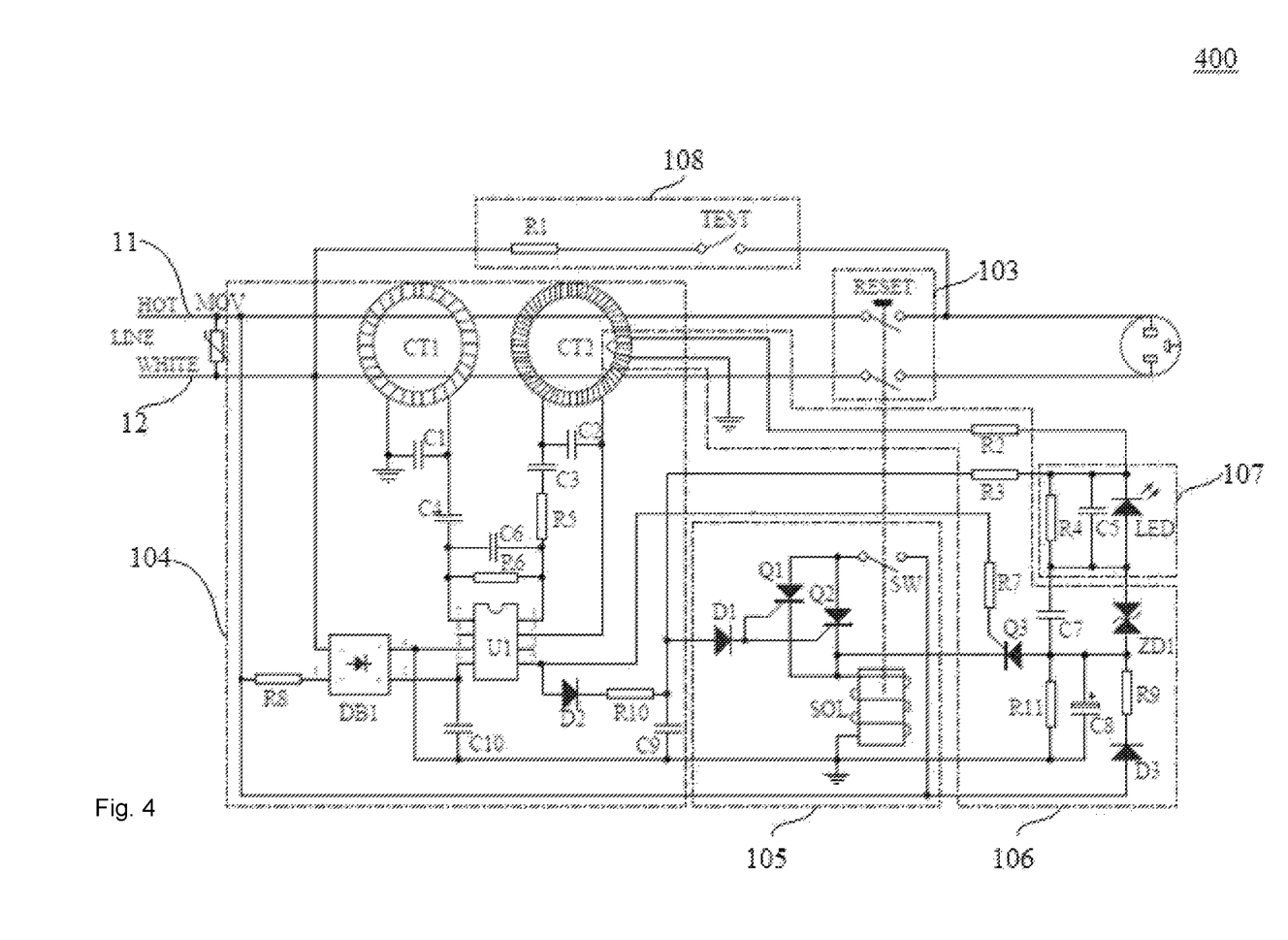
FIG. 4 is a circuit diagram of a leakage current detection and interruption device according to a third embodiment of the present invention.

FIG. 4 is a circuit diagram of a leakage current detection and interruption device according to a third embodiment of the present invention. Compared to the embodiment of FIG. 2, a main difference is that in the embodiment of FIG. 4, the leakage current detection module 104 includes two current transformers CT1 and CT2, where the first current transformer CT1 functions to detect a ground fault on the second current carrying line 12; the alarm module 107 is located after the voltage triggered element ZD1; and a full-bridge rectifier circuit DB1 is used to supply power to the circuit, where the auxiliary power supply circuit D2 and R8 in FIG. 2 is omitted.

The self-test module 106 includes voltage triggered element ZD1 (e.g. a trigger diode), capacitor C8 (the second capacitor), silicon controlled rectifier Q3 (the semiconductor device), and peripheral circuit elements. The alarm module 107 includes resistor R4 (the first resistor), capacitor C5 (the first capacitor), and a light emitting diode LED (alarm element) that is coupled in parallel with resistor R4 and capacitor C5 and coupled in series with capacitor C8.

When the leakage current detection and interruption device 400 functions normally, if a leakage current occurs on the first current carrying line 11 or second current carrying line 12, the second current transformer CT2 detects the leakage current and generates a corresponding induction signal at its secondary winding. Or, if a ground fault occurs on the second current carrying line 12, the first current transformer CT1 detects the ground fault and generates a corresponding induction signal at its secondary winding. The first and second current transformers CT1 and CT2 are coupled to leakage current detection chip U1 to transfer the induction signals to leakage current detection chip U1 for processing. If the processed signal is greater than a preset threshold, leakage current detection chip U1 outputs a high voltage level at pin 5 (leakage fault signal), otherwise it outputs a low voltage signal. The high voltage level at pin 5 is provided via diode D2 and resistor R10 to the control electrodes of silicon controlled rectifiers Q1 and Q2, triggering silicon controlled rectifiers Q1 and/or Q2 to become conductive. As a result, a current flows through the solenoid SOL, generating a sufficiently large electromagnetic force to drive the reset switch RESET of the switch module 103 to disconnect the electrical connection between the input and output ends, and to open the auxiliary switch SW at the same time.

The leakage current detection and interruption device 400 has a self-test function. A current from the first current carrying line 11 charges capacitor C8 via current path 11-D3-R9. As the voltage across capacitor C8 rises, the voltage across voltage triggered element ZD1 rises with it. After a predetermined time period, the voltage across voltage triggered element ZD1 reaches its trigger voltage, triggering it to become conductive. As a result, a current flows through current path C8-C5-R2 to generate a simulated leakage current. The voltage on capacitor C8 also charges capacitor C9 via resistor R3. When the leakage current detection and interruption device 400 functions normally, i.e., both leakage current detection module 104 and drive module 105 function normally, if the second current transformer CT2 detects the simulated leakage current and generates a corresponding induction signal at its secondary winding and transfers the signal to leakage current detection chip U1, leakage current detection chip U1 outputs a high voltage level at pin 5, triggering silicon controlled rectifier Q3 to become conductive. At this time, capacitor C8 is rapidly discharged via silicon controlled rectifier Q3 and solenoid SOL and the voltage across it drops rapidly. When the voltage drops to below the trigger voltage of voltage triggered element ZD1, the voltage triggered element ZD1 turns off. The time period of this process is relatively short. By setting the capacitances of capacitors C5 and C9, the voltages across capacitors C5 and C9 rise slowly during this time period, and remain relatively low, insufficient to cause the light emitting diode LED to emit light and insufficient to trigger silicon controlled rectifiers Q1 and Q2 to become conductive, so as not to affect the normal function of the device 400. Therefore, during this process the light emitting diode LED does not emit light, and switch module 103 does not trip (i.e., it remains closed).

When the leakage current detection module 104 malfunctions and cannot detect the simulated leakage current, pin 5 of leakage current detection chip U1 remains at the low voltage level. Therefore, silicon controlled rectifier Q3 is not triggered to conduct, so capacitor C8 cannot discharge via silicon controlled rectifier Q3 and solenoid SOL. As a result, the voltage triggered element ZD1 remains conductive for a long time period, allowing a current to continuously charge capacitor C5 via capacitor C8 and charge capacitor C9 via current path C8-R4-R3 (i.e., a self-test fault signal is produced). When the voltages across capacitors C5 and C9 rise to certain levels, sufficient to trigger the light emitting diode LED to emit light and sufficient to trigger silicon controlled rectifiers Q1 and Q2 to conduct, the light emitting diode LED emits light (i.e. alarm signal). If the drive module 105 functions normally, then silicon controlled rectifiers Q1 and/or Q2 become conductive; as a result, a current flows through the solenoid SOL, generating a sufficiently large electromagnetic force to drive the reset switch RESET of the switch module 103 to disconnect the electrical connection between the input and output ends. But if the drive module 105 also malfunctions, e.g. the solenoid SOL is an open circuit, then the switch module 103 remains closed.

If the leakage current detection module 104 functions normally but the drive module 105 malfunctions, e.g. the solenoid SOL is an open circuit, when the second current transformer CT2 detects the simulated leakage current and generates a corresponding induction signal at its secondary winding and transfers the signal to the leakage current detection chip U1, leakage current detection chip U1 outputs a high voltage level at pin 5, triggering silicon controlled rectifier Q3 to become conductive. But because the solenoid SOL is an open circuit, capacitor C8 cannot discharge via the path of silicon controlled rectifier Q3 and solenoid SOL. As a result, the voltage triggered element ZD1 remains conductive for a long time period, allowing a current to continuously charge capacitor C5 via capacitor C8 and to charge capacitor C9 via current path C8-R4-R3 (i.e., a self-test fault signal is produced). Thus, the voltages across capacitors C5 and C9 rise to certain levels, sufficient to trigger the light emitting diode LED to emit light (i.e. the alarm signal) and sufficient to trigger silicon controlled rectifiers Q1 and Q2 to conduct. Therefore, the light emitting diode LED emits light and the switch module 103 remains closed.

As capacitor C8 is further discharged, voltage triggered element ZD1 turns off and light emitting diode LED is extinguished. The current again charges capacitor C8 via current path 11-D3-R9; as the voltage across capacitor C8 rises again, voltage triggered element ZD1 is again conductive, and light emitting diode LED again emits light. This process repeats itself, with the result that the light emitting diode LED flashes (i.e. a flashing light signal is generated). Thus, when the leakage current detection module 104 and/or drive module 105 malfunctions, the light emitting diode LED produces a flashing light signal to alert the user, thereby avoiding danger and eliminating the hidden safety threat, further improving the safety of the device.

Further, the leakage current detection and interruption device 400 of FIG. 4 can test the leakage current detection and interruption function. This operation is similar to the one in the device 200 of FIG. 2, and detailed descriptions are omitted here.

Figure 5:
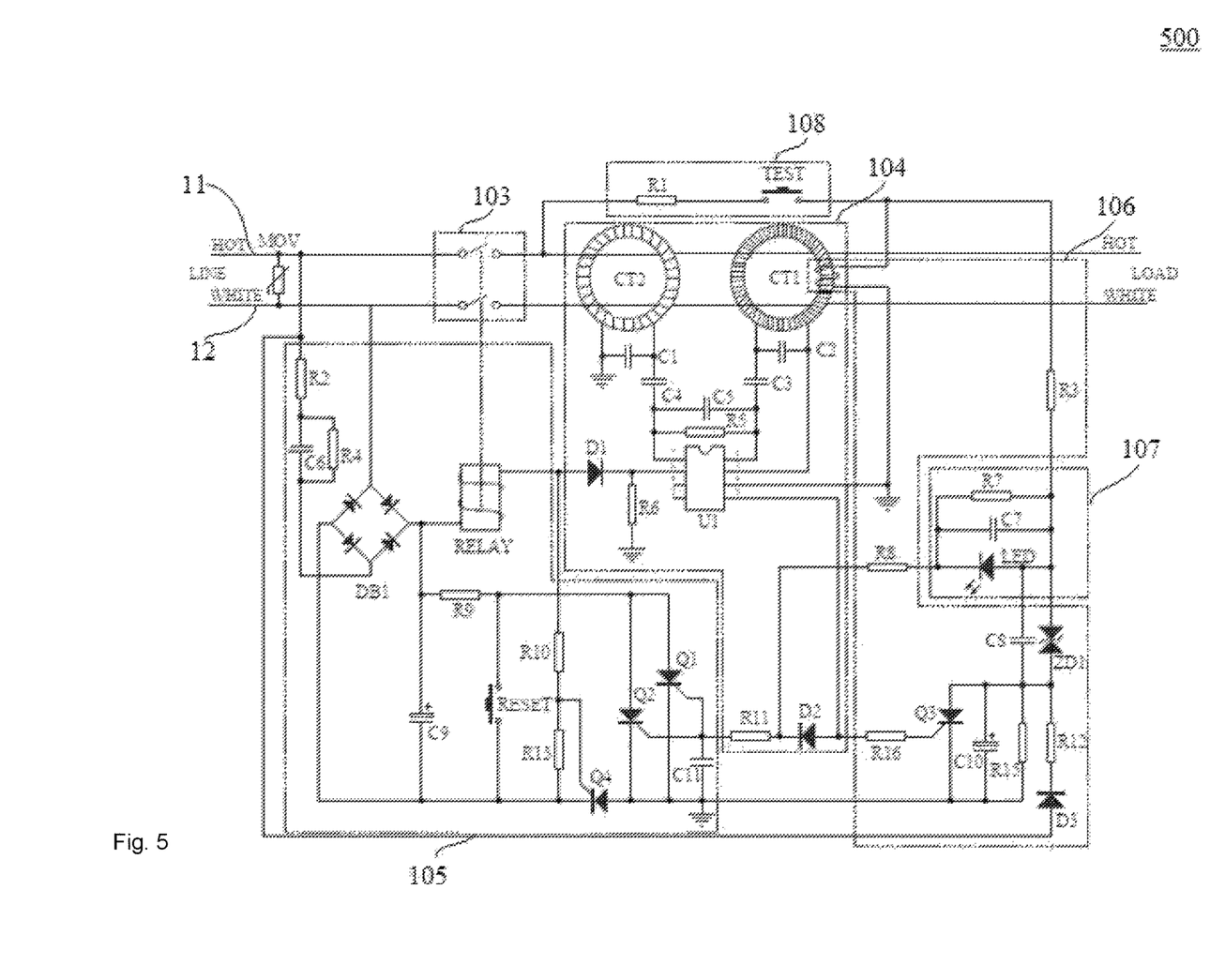
FIG. 5 is a circuit diagram of a leakage current detection and interruption device according to a fourth embodiment of the present invention.

FIG. 5 is a circuit diagram of a leakage current detection and interruption device according to a fourth embodiment of the present invention. Compared to the embodiment of FIG. 2, a main difference is that in the embodiment of FIG. 5, the leakage current detection module 104 includes two current transformers CT1 and CT2, where the second current transformer CT2 functions to detect ground fault on the second current carrying line 12; the alarm module 107 is located after voltage triggered element ZD1; and a full-bridge rectifier circuit DB1 is used to supply power to the circuit. Further, in the drive module 105 of FIG. 5, a relay RELAY replaces the solenoid SOL of FIG. 2.

The self-test module 106 includes voltage triggered element ZD1 (e.g. a trigger diode), capacitor C10 (the second capacitor), silicon controlled rectifier Q3 (the semiconductor device), and peripheral circuit elements. The alarm module 107 includes resistor R7 (the first resistor), capacitor C7 (the first capacitor), and a light emitting diode LED (alarm element) that is coupled in parallel with resistor R7 and capacitor C7 and coupled in series with capacitor C10.

When the leakage current detection and interruption device 500 functions normally, when the input end LINE is energized, a current charges capacitor C9 via the current path 11-R2-C6-DB1. Capacitor C9 is coupled in parallel with the circuit of relay RELAY and resistors R10 and R13, so the voltage across capacitor C9 is voltage-divided by relay RELAY and resistors R10 and R13. When the voltage across capacitor C9 reaches a preset threshold, a current generates a voltage across relay RELAY and resistor R10 to trigger silicon controlled rectifier Q4 to become conductive. A current path 11-R2-C6-DB1-RELAY-D1-U1-Q4-DB1-12 is formed between the two current carrying lines. Thus, a large current flows through relay RELAY, driving the two switches of the switch module 103 to close; meanwhile, leakage current detection chip U1 receives a supplied power and starts to operate.

When the leakage current detection and interruption device 500 functions normally, if a leakage current occurs on the first current carrying line 11 or second current carrying line 12, the first current transformer CT1 detects the leakage current and generates a corresponding induction signal at its secondary winding. Or, if a ground fault occurs on the second current carrying line 12, the second current transformer CT2 detects the ground fault and generates a corresponding induction signal at its secondary winding. The first and second current transformers CT1 and CT2 are coupled to leakage current detection chip U1 to transfer the induction signals to leakage current detection chip U1 for processing. If the processed signal is greater than a preset threshold, leakage current detection chip U1 outputs a high voltage level at its pin 5 (leakage fault signal), otherwise it outputs a low voltage signal. The high voltage level at pin 5 is provided via diode D2 and resistor R11 to the control electrodes of silicon controlled rectifiers Q1 and Q2, triggering silicon controlled rectifiers Q1 and/or Q2 to become conductive. By setting resistor R9 to have a relatively small resistance, a majority of the current flows through the current path 11-R2-C6-DB1-R9-Q1/Q2-Q4-DB1-12, so that the current flowing through relay RELAY drops sharply. As a result, the relay RELAY cannot maintain the closed state of the two switches of the switch module 103, resulting in disconnection of the electrical connection between the input and output ends.

The leakage current detection and interruption device 500 has a self-test function. A current from the first current carrying line 11 charges capacitor C10 via current path 11-D3-R12. As the voltage across capacitor C10 rises, the voltage across voltage triggered element ZD1 rises with it. After a predetermined time period, the voltage across voltage triggered element ZD1 reaches its trigger voltage, triggering it to become conductive. As a result, a current flows through the path C10-R3 to generate a simulated leakage current; the voltage on capacitor C10 also charges capacitor C11 via resistors R8 and R11. When the leakage current detection and interruption device 500 functions normally, i.e., both the leakage current detection module 104 and drive module 105 function normally, if the first current transformer CT1 detects the simulated leakage current and generates a corresponding induction signal at its secondary winding and transfers the signal to the leakage current detection chip U1, leakage current detection chip U1 outputs a high voltage level at pin 5, triggering silicon controlled rectifier Q3 to become conductive. At this time, capacitor C10 is rapidly discharged via silicon controlled rectifier Q3 and the voltage across it drops rapidly. When the voltage drops to below the trigger voltage of voltage triggered element ZD1, voltage triggered element ZD1 turns off. The time period of this process is relatively short. By setting the capacitances of capacitors C7 and C11, the voltages across capacitors C7 and C11 rise slowly during this time period, and remain relatively low, insufficient to cause the light emitting diode LED to emit light and insufficient to trigger silicon controlled rectifiers Q1 and Q2 to become conductive, so as not to affect the normal function of the device 500. Therefore, during this process, the light emitting diode LED does not emit light, and switch module 103 does not trip (i.e., it remains closed).

When the leakage current detection module 104 malfunctions and cannot detect the simulated leakage current, pin 5 of leakage current detection chip U1 remains at the low voltage level. Therefore, silicon controlled rectifier Q3 is not triggered to conduct, so capacitor C10 cannot discharge via silicon controlled rectifier Q3. As a result, the voltage triggered element ZD1 remains conductive for a long time period, allowing a current to continuously charge capacitor C7 via capacitor C10 and charge capacitor C11 via current path C10-R7-R8-R11 (i.e., a self-test fault signal is produced). When the voltages across capacitors C7 and C11 rise to certain levels, sufficient to trigger the light emitting diode LED to emit light and sufficient to trigger silicon controlled rectifiers Q1 and Q2 to conduct, the light emitting diode LED emits light (i.e. alarm signal). If the drive module 105 functions normally, then silicon controlled rectifiers Q1 and/or Q2 become conductive; as a result, the current flowing through relay RELAY drops sharply, resulting in disconnection of the electrical connection between the input and output ends.

If the drive module 105 malfunctions, e.g. the relay RELAY is an open circuit, the two switches of the switch module 103 are open, and leakage current detection chip U1 loses power supply so the self-test module 106 cannot perform self-test. More specifically, even when the first current transformer CT1 detects the simulated leakage current, pin 5 of leakage current detection chip U1 remains at the low voltage level, so silicon controlled rectifier Q3 is not triggered to conduct. As a result, capacitor C10 cannot discharge via silicon controlled rectifier Q3, and voltage triggered element ZD1 remains conductive for a long time period, allowing a current to continuously charge capacitor C7 via capacitor C10 and to charge capacitor C11 via current path C10-R7-R8-R11 (i.e., a self-test fault signal is produced). Thus, the voltage across capacitor C7 rises to a certain level, sufficient to trigger the light emitting diode LED to emit light (i.e. the alarm signal). Therefore, the light emitting diode LED emits light.

As capacitor C10 is further discharged, voltage triggered element ZD1 turns off and light emitting diode LED is extinguished. The current again charges capacitor C10 via current path 11-D3-R12; as the voltage across capacitor C10 rises again, voltage triggered element ZD1 is again conductive, and light emitting diode LED again emits light. This process repeats itself, with the result that light emitting diode LED flashes (i.e. a flashing light signal is generated). Thus, when the leakage current detection module 104 and/or drive module 105 malfunctions, light emitting diode LED produces a flashing light signal to alert the user, thereby avoiding danger and eliminating the hidden safety threat, further improving the safety of the device.

Further, the leakage current detection and interruption device 500 of FIG. 5 can test the leakage current detection and interruption function. This operation is similar to the one in the device 200 of FIG. 2, and detailed descriptions are omitted here.

Figure 6:
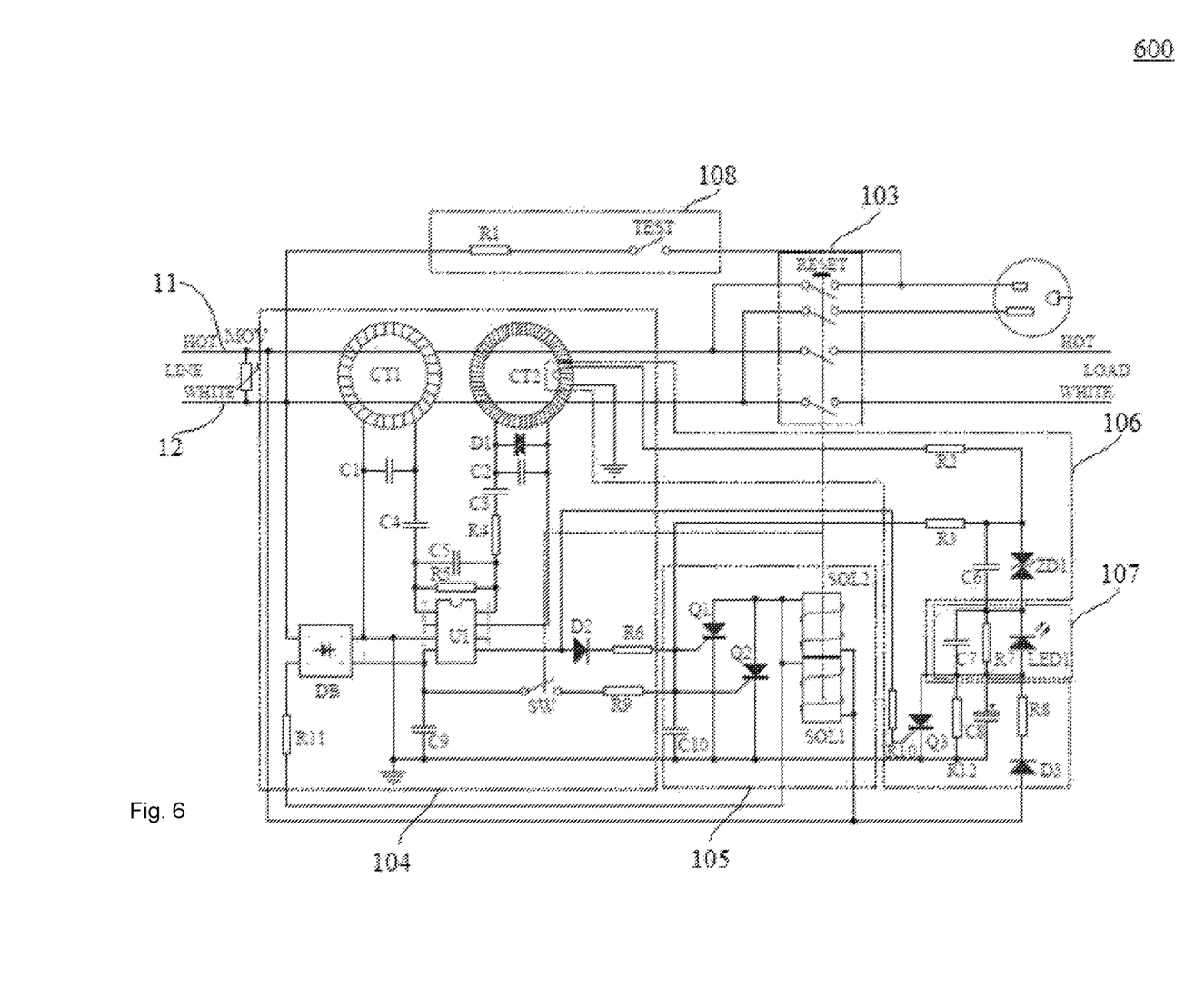
FIG. 6 is a circuit diagram of a leakage current detection and interruption device according to a fifth embodiment of the present invention.

FIG. 6 is a circuit diagram of a leakage current detection and interruption device according to a fifth embodiment of the present invention. Compared to the embodiment of FIG. 2, a main difference is that in the embodiment of FIG. 6, the leakage current detection module 104 includes two current transformers CT1 and CT2, where the first current transformer CT1 functions to detect ground fault on the second current carrying line 12; a full-bridge rectifier circuit DB is used to supply power to the circuit; and the drive module 105 includes two solenoids SOL1 and SOL2.

The self-test module 106 includes voltage triggered element ZD1 (e.g. a trigger diode), capacitor C8 (the second capacitor), silicon controlled rectifier Q3 (the semiconductor device), and peripheral circuit elements. The alarm module 107 includes resistor R7 (the first resistor), capacitor C7 (the first capacitor), and a light emitting diode LED1 (alarm element) that is coupled in parallel with resistor R7 and capacitor C7 and coupled in series with capacitor C8.

When the leakage current detection and interruption device 600 functions normally, a current path 11-SOL1-SOL2-R11-DB-U1-DB-12 is formed between the two current carrying lines, and leakage current detection chip U1 functions normally. If a leakage current occurs on the first current carrying line 11 or second current carrying line 12, the second current transformer CT2 detects the leakage current and generates a corresponding induction signal at its secondary winding. Or, if a ground fault occurs on the second current carrying line 12, the first current transformer CT1 detects the ground fault and generates a corresponding induction signal at its secondary winding. The first and second current transformers CT1 and CT2 are coupled to leakage current detection chip U1 to transfer the induction signals to leakage current detection chip U1 for processing. If the processed signal is greater than a preset threshold, leakage current detection chip U1 outputs a high voltage level at its pin 5 (leakage fault signal), otherwise it outputs a low voltage signal. The high voltage level at pin 5 is provided via diode D2 and resistor R6 to the control electrodes of silicon controlled rectifiers Q1 and Q2, triggering silicon controlled rectifiers Q1 and/or Q2 to become conductive. As a result, a current flows through solenoids SOL1 and SOL2, generating a sufficiently large electromagnetic force to drive the reset switch RESET of the switch module 103 to disconnect the electrical connection between the input and output ends.

When performing a reset, the user manually depresses the button of the reset switch RESET. By the mechanical linkage design, when the reset button RESET is depressed, the auxiliary switch SW is closed. But the downward movement of the reset button is blocked by a metal plate. Because the auxiliary switch SW is closed, the silicon controlled rectifiers Q1 and/or Q2 are triggered via resistor R9 to become conductive. As a result, large currents flow through solenoids SOL1 and SOL2, generating an electromagnetic force to drive the metal plate (that was blocking the reset button) to move away, so that the reset button continues to move downwardly under the depression of the user, to a locking position. This indicates that reset is complete, and when the user releases the reset button RESET, the auxiliary switch SW becomes open.

The leakage current detection and interruption device 600 has a self-test function. A current from the first current carrying line 11 charges capacitor C8 via the current path 11-D3-R8. As the voltage across capacitor C8 rises, the voltage across voltage triggered element ZD1 rises with it. After a predetermined time period, the voltage across voltage triggered element ZD1 reaches its trigger voltage, triggering it to become conductive. As a result, a current flows through the path C8-C7-R2 to generate a simulated leakage current; the voltage on capacitor C8 also charges capacitor C10 via resistor R3. When the leakage current detection and interruption device 600 functions normally, i.e., both the leakage current detection module 104 and drive module 105 function normally, if the second current transformer CT2 detects the simulated leakage current, it generates a corresponding induction signal at its secondary winding and transfers the signal to leakage current detection chip U1, causing leakage current detection chip U1 to output a high voltage level at pin 5, triggering silicon controlled rectifier Q3 to become conductive. At this time, capacitor C8 is rapidly discharged via silicon controlled rectifier Q3 and the voltage across it drops rapidly. When the voltage drops to below the trigger voltage of voltage triggered element ZD1, voltage triggered element ZD1 turns off. The time period of this process is relatively short. By setting the capacitances of capacitors C7 and C10, the voltages across capacitors C7 and C10 rise slowly during this time period, and remain relatively low, insufficient to cause the light emitting diode LED1 to emit light, and insufficient to trigger silicon controlled rectifiers Q1 and Q2 to become conductive, so as not to affect the normal function of the device 600. Therefore, during this process the light emitting diode LED1 does not emit light, and switch module 103 does not trip (i.e., it remains closed).

When the leakage current detection module 104 malfunctions and cannot detect the simulated leakage current, pin 5 of leakage current detection chip U1 remains at the low voltage level. Therefore, silicon controlled rectifier Q3 is not triggered to conduct, so capacitor C8 cannot discharge via silicon controlled rectifier Q3. As a result, the voltage triggered element ZD1 remains conductive for a long time period, allowing a current to continuously charge capacitor C7 by capacitor C8 and charge capacitor C10 via current path C8-R7-R3 (i.e., a self-test fault signal is produced). When the voltages across capacitors C7 and C10 rise to certain levels, sufficient to trigger light emitting diode LED1 to emit light and sufficient to trigger silicon controlled rectifiers Q1 and Q2 to conduct, light emitting diode LED1 emits light (i.e. alarm signal). If the drive module 105 functions normally, then silicon controlled rectifiers Q1 and/or Q2 become conductive; as a result, currents flow through solenoids SOL1 and SOL2, generating a sufficiently large electromagnetic force to drive the reset switch RESET of the switch module 103 to disconnect the electrical connection between the input and output ends.

As capacitor C8 is further discharged, voltage triggered element ZD1 turns off and light emitting diode LED1 is extinguished. The current again charges capacitor C8 via current path 11-D3-R8; as the voltage across capacitor C8 rises again, voltage triggered element ZD1 is again conductive, and light emitting diode LED1 again emits light. This process repeats itself, with the result that light emitting diode LED1 flashes (i.e. a flashing light signal is generated). Thus, when the leakage current detection module 104 and/or drive module 105 malfunctions, light emitting diode LED1 produces a flashing light signal to alert the user, thereby avoiding danger and eliminating the hidden safety threat, further improving the safety of the device.

Further, the leakage current detection and interruption device 600 of FIG. 6 can test the leakage current detection and interruption function. This operation is similar to the one in the device 200 of FIG. 2, and detailed descriptions are omitted here.

In a second aspect, the present invention provides an electrical power connection device, which includes a body and a leakage current detection and protection device according to any one of the above embodiments disposed inside the body.

In a third aspect, the present invention provides an electrical appliance, which includes an electrical load, and an electrical power connection device coupled between a power supply and the load to supply power to the load, where the electrical power connection device employs a leakage current detection and protection device according to any one of the above embodiments.

While the present invention is described above using specific examples, these examples are only illustrative and do not limit the scope of the invention. It will be apparent to those skilled in the art that various modifications, additions and deletions can be made to the leakage current detection and interruption device of the present invention without departing from the spirit or scope of the invention.

The invention claimed is:

1. A leakage current detection and interruption device, comprising:
   a plurality of current carrying lines having an input end and an output end;
   a switch module, coupled on the plurality of current carrying lines between the input end and the output end, configured to connect or disconnect an electrical connection between the input end and the output end;

a leakage current detection module, configured to detect a leakage current signal on the plurality of current carrying lines and to generate a leakage fault signal in response to detecting the leakage current signal;

a drive module, coupled to the switch module and the leakage current detection module, configured to receive the leakage fault signal, and to drive the switch module to disconnect the electrical connection in response to the leakage fault signal;

a self-test module, coupled to the leakage current detection module and the drive module, configured to periodically generate a simulated leakage current signal to detect a malfunction in the leakage current detection module and/or the drive module, and to generate a self-test fault signal in response to detecting the malfunction of the leakage current detection module and/or the drive module; and an alarm module, coupled to the self-test module, configured to receive the self-test fault signal, and to generate an alarm signal in response to the leakage fault signal and/or the self-test fault signal, wherein the alarm module includes an alarm element for generating the alarm signal, wherein the alarm signal includes a flashing light signal and/or an intermittent audible signal, wherein the self-test module includes a voltage triggered diode and a capacitor, wherein the capacitor is charged by one of the current carrying lines and periodically generates the simulated leakage current signal in cooperation with the voltage triggered diode, and wherein in response to the malfunction of the leakage current detection module and/or the drive module, the voltage triggered diode is turned on and off alternatingly in response to repeated charging and discharging of the capacitor, and wherein the alarm element is turned on and off alternatingly in response to the turning on and off of the voltage triggered diode to generate the flashing light signal and/or the intermittent audible signal.

2. The device of claim 1, wherein the alarm element includes at least one of a buzzer, a speaker, an indicator light, and a light emitting element.

3. The device of claim 1, wherein the alarm module includes another capacitor and/or a resistor, coupled in parallel with the alarm element.

4. The device of claim 1, wherein the self-test module further includes a semiconductor device, wherein when both the leakage current detection module and the drive module function normally, the semiconductor device is configured to be triggered under action of the leakage fault signal to become conductive to provide a discharge path for the capacitor, and wherein when the leakage current detection module and/or the drive module has a malfunction, the semiconductor device remains non-conductive and provide no discharge path for the capacitor, wherein the self-test module generates the self-test fault signal in response thereto.

5. The device of claim 4, wherein the semiconductor device is selected from: a silicon controlled rectifier, a bipolar junction transistor, a field-effect transistor, and a photocoupler.

6. The device of claim 1, further comprising a monitor module, coupled to the leakage current detection module, wherein the monitor module includes a test switch and is configured to generate a simulated leakage fault signal in response to the test switch being operated, to detect whether the device is functioning normally.

7. An electrical power connection device, comprising:
a body; and
a leakage current detection and interruption device of claim 1, disposed inside the body.

8. An electrical appliance, comprising:
an electrical load; and
an electrical power connection device coupled between a power supply and the electrical load, configured to supply power to the electrical load, wherein the electrical power connection device includes a leakage current detection and interruption device of claim 1.

* * * * *